United States Patent
Ozawa (10) Patent No.: US 6,765,560 B1
(45) Date of Patent: Jul. 20, 2004

(54) DISPLAY DEVICE AND ELECTRONIC DEVICE

(75) Inventor: Tokuroh Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/581,436

(22) PCT Filed: Oct. 12, 1999

(86) PCT No.: PCT/JP99/05618

§ 371 (c)(1),
(2), (4) Date: Sep. 21, 2000

(87) PCT Pub. No.: WO00/22604

PCT Pub. Date: Apr. 20, 2000

(30) Foreign Application Priority Data

Oct. 13, 1998 (JP) .......................................... 10/291213

(51) Int. Cl.⁷ ................................................ G09G 5/00
(52) U.S. Cl. ........................ 345/204; 345/205; 345/206
(58) Field of Search ................................ 345/8, 48, 33, 345/89, 90, 92, 204–206, 211, 212, 39, 46, 82, 83, 634, 641; 313/504; 327/355; 315/169.11; 326/27

(56) References Cited

U.S. PATENT DOCUMENTS

| | | | | |
|---|---|---|---|---|
| 5,247,190 A | * | 9/1993 | Friend et al. ................... 345/33 |
| 5,341,087 A | * | 8/1994 | Van Leeuwen .............. 323/315 |
| 5,420,604 A | * | 5/1995 | Scheffer et al. .............. 345/100 |
| 5,608,339 A | * | 3/1997 | Fujiwara ....................... 326/27 |
| 5,644,333 A | * | 7/1997 | King et al. ................... 345/641 |
| 5,696,527 A | * | 12/1997 | King et al. ................... 345/634 |
| 5,731,774 A | * | 3/1998 | Fujii et al. ................... 341/144 |
| 5,784,073 A | * | 7/1998 | Yamazaki et al. ........... 345/537 |
| 5,812,105 A | * | 9/1998 | Van de Ven ................... 345/46 |
| 5,923,309 A | | 7/1999 | Ishizuka et al. ............... 345/82 |
| 6,020,865 A | | 2/2000 | Okuda et al. .................. 345/82 |
| 6,211,613 B1 | * | 4/2001 | May ............................ 313/504 |
| 6,229,376 B1 | * | 5/2001 | Geysen ....................... 327/355 |
| 6,288,496 B1 | * | 9/2001 | Suzuki et al. ............. 315/169.1 |
| 6,331,844 B1 | * | 12/2001 | Okumura et al. ........... 345/100 |
| 6,373,419 B1 | * | 4/2002 | Nakao ............................ 345/8 |

FOREIGN PATENT DOCUMENTS

| | | | | |
|---|---|---|---|---|
| JP | A 9-101759 | | 4/1997 | |
| JP | A 9-305146 | | 11/1997 | |
| JP | 2000-122608 A | * | 4/2000 | ................. 345/204 |

* cited by examiner

Primary Examiner—Amare Mengistu
Assistant Examiner—Prabodh M. Dharia
(74) Attorney, Agent, or Firm—Oliff & Berridge PLC (57) ABSTRACT

According to the present invention, as a current-driven light-emitting means is driven by a current-adding D/A converter driving means, it is possible to drive the light-emitting means with large driving power. Moreover, electric power consumption may be reduced by the generation of wasteful drive currents being suppressed. Therefore, obtained are images of high intensity in an efficient manner with low electric power consumption.

18 Claims, 8 Drawing Sheets

DISPLAY DEVICE AND ELECTRONIC DEVICE

TECHNICAL FIELD

The present invention relates to the technical field of a display device comprising a light-emitting element per pixel and an electronic apparatus comprising such display device.

BACKGROUND ART

Conventionally, with display devices comprising a light-emitting element per pixel, after a digitized image signal is converted into an analog image signal, such analog image signal is applied to the light-emitting elements.

Here, in order to convert the digital image signal into an analog image signal, it is necessary to utilize a so-called digital/analog converter (hereinafter referred to as a "D/A converter").

As such D/A converter, so-called capacitive D/A converters and so-called resistive D/A converters are known.

Among the above, as the resistive D/A converter, there is a D/A converter utilizing so-called ladder resistance wherein resistors are connected in a ladder shape. As D/A converters utilizing ladder resistance may be integrated easily, they are preferable for being incorporated into an active-matrix type display device.

Nevertheless, in order to realize large driving power upon using a D/A converter utilizing ladder resistance, it is necessary to lower the value of resistance of the respective resistors structuring the D/A converter. Thus, the overall electric power consumption will increase. Particularly in an active-matrix type display device, electric power consumption is severe since D/A converters are necessary per multitude of light-emitting elements.

Moreover, in order to realize large driving power upon using a capacitive D/A converter, it is necessary to increase the capacitance value within the D/A converter. Thus, integration becomes difficult.

DISCLOSURE OF THE INVENTION

The present invention realizes a display device capable of driving light-emitting elements utilizing drive currents having a large current value and lowering electric power consumption by suppressing current consumption, and an electronic apparatus employing such display device.

The display device of the present invention comprises:
a plurality of current-driven light-emitting means respectively contained in a plurality of pixels formed in a matrix shape; and
driving means for converting, by adding a current having a current value corresponding to the digital value contained in the digital data signal, the digital data signal into an analog data signal, applying the analog data signal to the light-emitting means, and driving the light-emitting means.

The plurality of pixels is formed on a substrate, such as a transparent substrate. Thin-film current-driven light-emitting elements (light-emitting elements wherein the luminance degree changes in proportion to the current quantity to be flowed into the diode) may be used as the plurality of light-emitting means.

As the driving means generates an analog data signal by adding a current, the light-emitting means is driven with large driving power and electric power consumption is lowered by the generation of wasteful drive currents being suppressed.

Preferably, the D/A converter includes a current mirror circuit for generating a current having a current value corresponding to the digital value contained in the digital data signal.

More preferably, the current-adding D/A converter includes a current mirror circuit for generating a current having a current quantity corresponding to the digital value contained in the digital data signal. By including a current mirror circuit, the analog data signal may be supplied to the light-emitting means efficiently.

Preferably, the driving means comprises additional-basic-current application means for constantly applying a prescribed additional basic current to the light-emitting means while making the light-emitting means illuminate in correspondence with the digital data signal.

The additional basic current may be a current having a prescribed current quantity set in advance and lower than the minimum current quantity within the range of currents in which the luminance of the light-emitting polymer changes in proportion to the current-luminance property of the light-emitting means.

By constantly applying the additional basic current to the light-emitting means while the light-emitting means is illuminating, the luminance of the light-emitting means will be a luminance in proportion to the current quantity of the analog data signal. Thereby, obtained are images accurately corresponding to the supplied digital data signal.

A display device of the present invention comprises:
a plurality of current-driven light-emitting means respectively contained in a plurality of pixels formed in a matrix shape;
data line driving means for converting, by adding a current having a current value corresponding to the digital value contained in the digital data signal, the digital data signal into an analog data signal, applying the analog data signal to the light-emitting means, and driving the light-emitting means;
a scanning line for supplying a scanning signal;
a data line connected to the data line driving means and for supplying the analog data signal; and
switching means connected to the scanning line, the data line, and the light-emitting means inside the pixel and for applying the analog data signal to the light-emitting means in correspondence with the scanning signal supplied from the scanning line and driving the light-emitting means.

As the data line driving means generates an analog data signal by adding a current, the light-emitting means is driven with a large driving power and electric power consumption is lowered by the generation of wasteful drive currents being suppressed.

By providing a switching means to each light-emitting means, realized is an active-matrix type display device capable of controlling the drive of the light-emitting means for each pixel. Thus, displayed are images of high resolution.

Preferably, the switching means is formed of a thin-film transistor (hereinafter referred to as "TFT"); for example, a polysiliconthin-filmtransistor. By employing the polysilicon thin-film transistor, suppressed is the lowering of the driving power pursuant to a long-term flow of strong current.

Preferably, the data line driving means includes a current-adding D/A converter for converting, by adding a current having a current value corresponding to the digital value contained in the digital data signal, the digital data signal into an analog data signal.

More preferably, the D/A converter includes a current mirror circuit for generating a current having a current value corresponding to the digital value contained in the digital data signal. By including a current mirror circuit, the analog data signal may be supplied to the light-emitting means efficiently.

The additional basic current may be a current having a prescribed current quantity set in advance and lower than the minimum current quantity within the range of currents in which the luminance of the light-emitting polymer changes in proportion to the current-luminance property of the light-emitting means.

By constantly applying the additional basic current to the light-emitting means while the light-emitting means is illuminating, the luminance of the light-emitting means will be a luminance in proportion to the current quantity of the analog data signal. Thereby, obtained are images accurately corresponding to the supplied digital data signal.

The light-emitting means of the present invention is preferably formed of a light-emitting polymer. By employing a light-emitting polymer, obtained are images of high intensity.

An electronic apparatus of the present invention comprises the display device of the present invention. Thus, it is possible to display images on the electronic apparatus of the present invention efficiently and with low electric power consumption.

BEST MODE FOR CARRYING OUT THE INVENTION (I) Embodiment of the Display Device The best mode for carrying out the invention is now explained with reference to the drawings.

Figure 1:
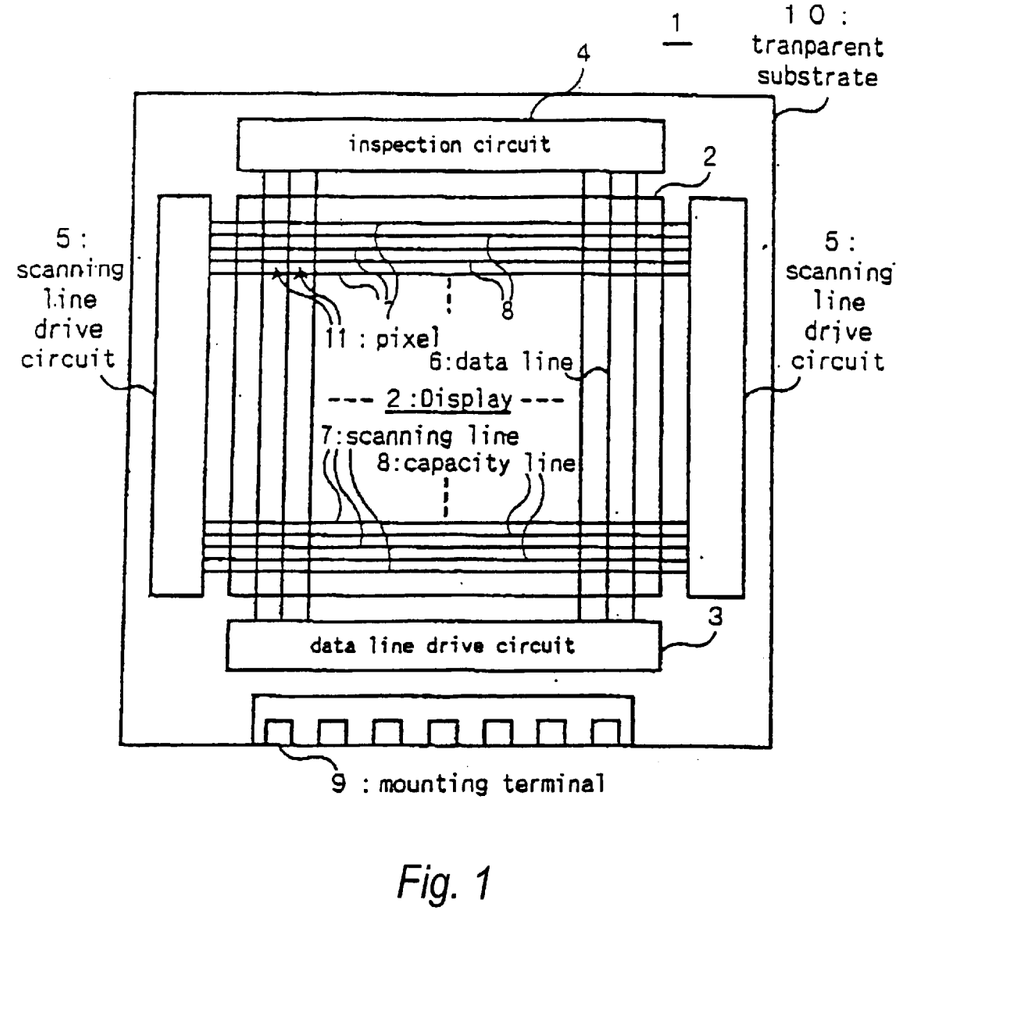
FIG. 1 is a plan view showing the overall structure of the display device according to the present invention.

Foremost, explained with reference to FIG. 1 is the summary of the overall structure of the active-matrix type display device employed in the present invention.

As shown with the plan view thereof in FIG. 1, with the display device 1 of the present embodiment, the center of the substrate; i.e., transparent substrate 10, becomes the display 2 where images are actually displayed. Around the display 2 on the transparent substrate 10, at the top and bottom of FIG. 1, a data line drive circuit 3 and an inspection circuit 4 are formed. The data line drive circuit works as the drive circuit (or data line drive circuit) for outputting an image signal to the data line 6 based on the images to be displayed. The inspection circuit 4 is used for inspecting the quality, defects, etc. of the display device 1 during manufacture or the shipment thereof.

Moreover, around the display 2 on the transparent substrate 10, at the left and right sides of FIG. 1, a scanning line drive circuit 5 is formed. This scanning line drive circuit 5 outputs a scanning signal to the scanning lines 7 based on the images to be displayed.

Furthermore, on the transparent substrate 10, mounting terminals 9 are formed on the exterior of the inspection circuit 4. The mounting terminals 9 are used for externally inputting an image signal, as well as various voltage and pulse signals.

Here, pixels 11 are respectively formed in correspondence with the intersection of the data line 6 and the scanning line 7 inside the display 2. Within a single pixel 11, as described later (cf. FIG. 3), a light-emitting polymer as the light-emitting means, a TFT as the driving means, and so on are formed.

In addition, capacity lines 8 for accumulative capacity describe later (cf. FIG. 2) are arranged on the display 2. The capacity lines 8 are parallel to the scanning lines 7 within the respective pixels 11.

Figure 2:
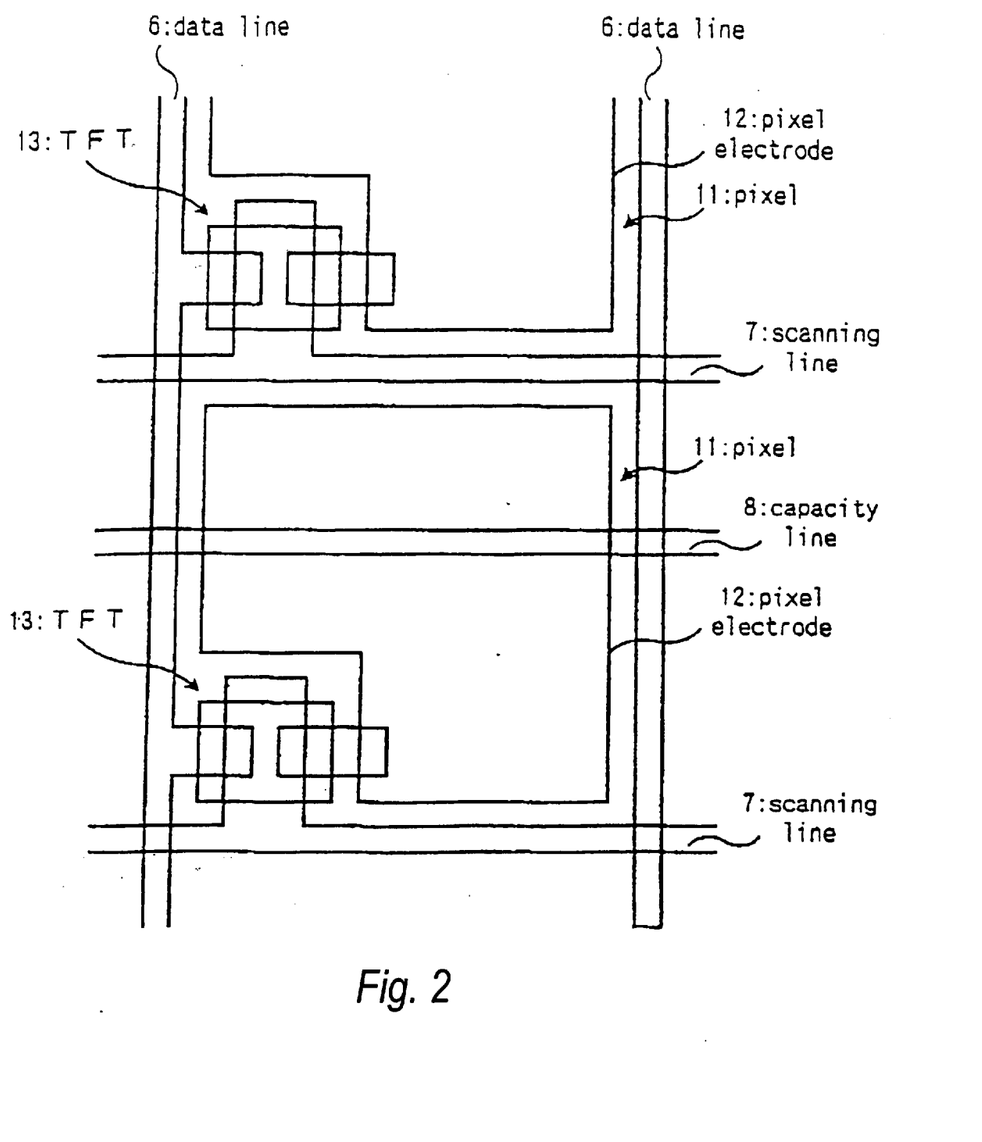
FIG. 2 is a plan view showing the specific structure of the pixel portion of the display device according to the present invention.
Figure 3:
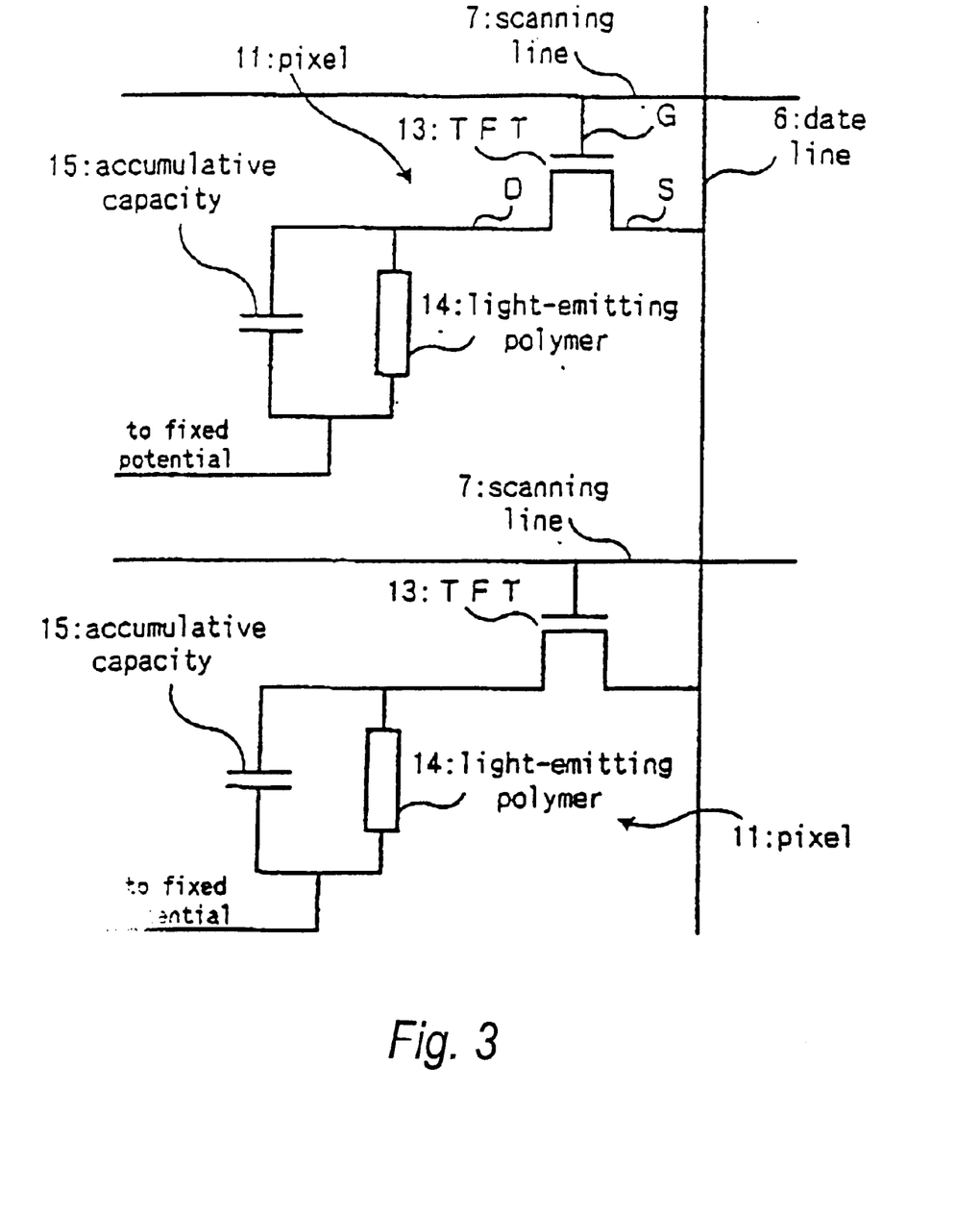
FIG. 3 is an equivalent circuit of the pixel portion of the display device according to the present invention.

Next, explained is the structural members contained in the pixel 11 with reference to FIGS. 2 and 3. FIG. 2 is a plan view showing the arrangement of the TFT and so on formed inside the pixel 11 with thin-film technology. FIG. 3 is an equivalent circuit regarding a single pixel 11.

As shown in FIG. 2, a pixel electrode 12 and TFT 13 are formed inside a single pixel 11. The pixel electrode 12 is used for applying current to the light-emitting polymer as described later. The TFT 13 works as a switching means for supplying an image signal from the data line 6 to the pixel electrode 12. The pixel electrode 12 and the TFT 13 are formed as thin films. The TFT 13 further comprises a semiconductor layer (semiconductor layer having a channel region, source region, and drain region) formed from poly-silicon.

A capacity line 8 is arranged in the position opposite to the pixel electrode 12. The line 8 forms the accumulative capacity described later (cf. FIG. 3) together with the pixel electrode 12.

Here, the light-emitting polymer is described in detail.

The light-emitting polymer is formed as a thin film in the display device 1 of the present embodiment. Specifically, the light-emitting polymer is formed by laminating a spacer layer, organic luminescent layer, and hole injection layer, and it self-illuminates in proportion to the current quantity of the flowing current.

The light-emitting polymer is a light-emitting element in which the illuminant contributing to the illumination is an organic material. The principle characteristics thereof are as follows.

(1) It can be easily made into ink and solution, and has a high potential for being formed into a thin film. Thus, it can be made into a thin film in a short period of time, and it is also easy to make a multi-layered thin film.

(2) The physical strength is strong upon being formed into a thin film. Thus, crystallization and cohesion due to aging are difficult to occur. Moreover, display defects such as sunspots will not be generated easily.

(3) Patterning into a desired shape is easy. It is also possible to use materials having photosensitivity. Thus, it is possible to conduct patterning directly with inkjet technology, printing technology, or the like.

(4) The molecular design is extremely diverse, and it is easy to add functions or control luminescent colors.

As such organic materials, specifically, the following substances may be used. As those having a luminescent color from red to orange, for example, poly [2-(2'-ethylhexyloxy)-5-methoxy-1,4-phenylenevinylene] (so-called MEH-PPV), poly [2-(3,7-dimethyloctyloxy)-5-methoxy-1,4-phenylenevinylene] (so-called $OC_1C_{10}PPV$) or poly [2-(2'-ethylhexyloxy)-5-methoxy-1,4-phenylene-(1-cyanovinylene)] (so-called MEH-CN-PPV), and so on. As those having a luminescent color of red, for example, poly [2,5-bis(hexyloxy)-1,4-phenylene(lcyanovinylene)] (so-called CN-PPV) or polythiofine, and so on. As those having a luminescent color of green, for example, poly (para-phenylenevinylene) (so-called PPV) or poly [2-(dimethyloctylsirile)-1,4-phenylenevinylene] (so-called DMOS-PPV), and so on. As those having a luminescent color from blue to green, for example, m-LPPP, and so on. As those having a luminescent color of blue, for example, poly (paraphenylene) L (so-called PPP), DO-PPP, PDAF, or P3V/PV5, and so on.

Next, the respective structural members contained in the pixel 11 and the illuminative operation of the pixel 11 are explained with reference to the equivalent circuit shown in FIG. 3.

As shown in FIG. 3, the gate electrode G of the TFT 13 is connected to the scanning line 7, the source electrode S is connected to the data line 6, the drain electrode D is connected to one end of the light-emitting polymer 14 and the accumulative capacity 15, respectively. The other end of the light-emitting polymer 14 and the accumulative capacity 15 are commonly connected to a prescribed fixed potential (not shown), respectively.

During the initial state where the light-emitting polymer 14 is OFF, a scanning signal is not applied to the scanning line 7. Thus, the TFT 13 is in an OFF state.

Foremost, pursuant to the data line drive circuit 3 described later, an analog image signal corresponding to the image signal is supplied to the data line 6. Then, in the timing corresponding to the supply of such analog image signal, a scanning signal is applied to the scanning line 7 from the scanning line drive circuit 5, and the TFT 13 becomes an ON state. As a result, the analog data signal transmitted from the data line 6 flows from the source electrode S to the drain electrode D, and is further applied to one electrode of the light-emitting polymer 14 and the accumulative capacity 15.

Thereby, the light-emitting polymer 14 begins to self-illuminate with the luminance in proportion to the current quantity of the applied analog data signal. Simultaneously, electric charge begins accumulating on the accumulative capacity 15.

Thereafter, even if the supply of the analog data signal from the data line 6 is finished, the current continues to flow to the light-emitting polymer 14 and illumination is maintained while the accumulated electric charge remains in the accumulative capacity 15.

Figure 4:
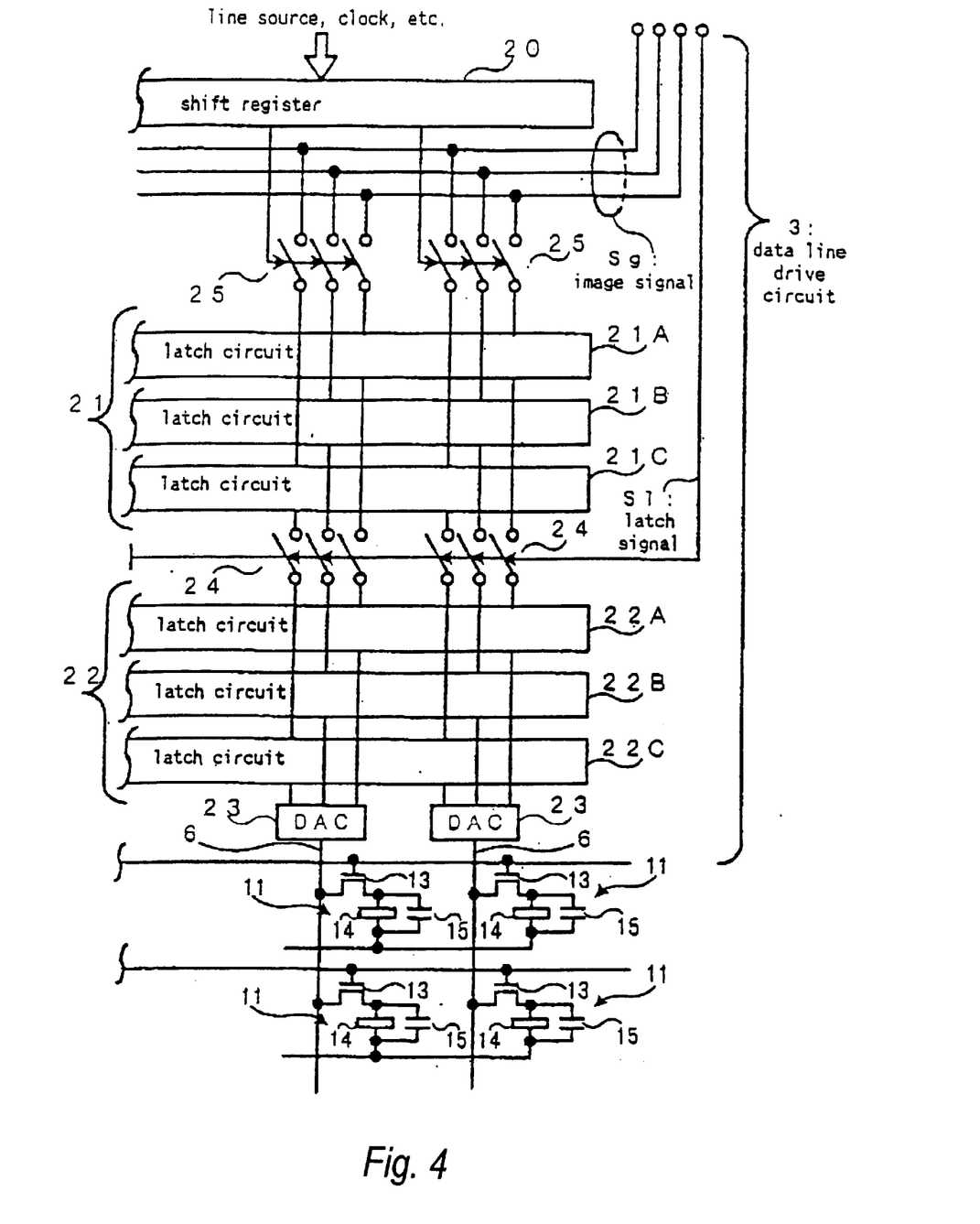
FIG. 4 is a block diagram showing the structure of the (data line) drive circuit.
Figure 5:
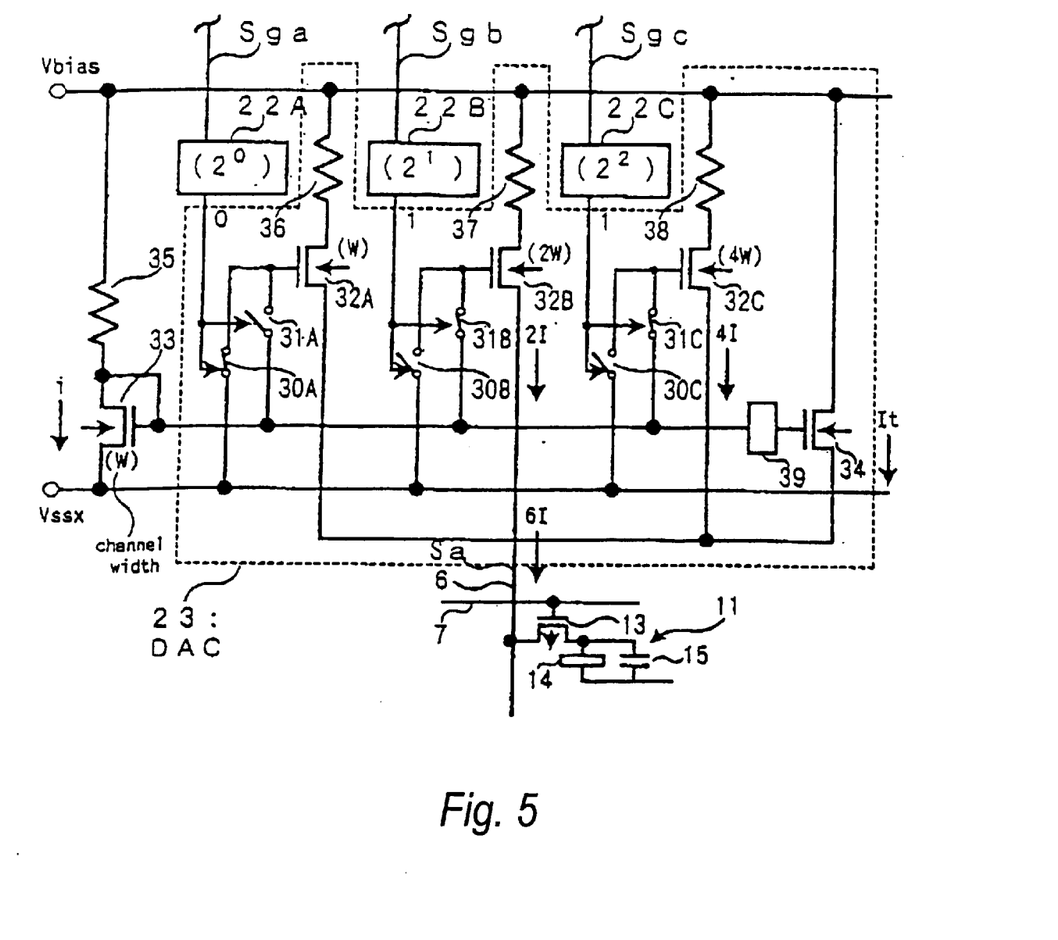
FIG. 5 is a circuit diagram showing the detailed structure of the D/A converter according to the present invention.

Next, the structure and operation of the data line drive circuit 3 are explained with reference to FIGS. 4 and 5. FIG. 4 is a block diagram showing the schematic structure of the data line drive circuit 3. FIG. 5 is a circuit diagram showing the detailed structure (of a portion corresponding to only a single pixel 11) of a second latch circuit and the D/A converter described later, among the data line drive circuit 3 shown in FIG. 4.

Here, the structure of the data line drive circuit 3 explained below is a case wherein the image signal input externally via the mounting terminals 9 is a 3-bit digital image signal. Further, the data line drive circuit 3 shown in FIG. 4 is of a structure which drives the respective TFTs 13 in a so-called line sequence.

As shown in FIG. 4, the data line drive circuit 3 is structured by comprising a shift register 20, switches 24 and 25, first latch circuit 21, second latch circuit 22, and a D/A converter 23 provided for each data line 6.

The first latch circuit 21 is structured of a latch circuit 21A, latch circuit 21B, and latch circuit 21C in correspondence with the respective bits in the image signal.

The second latch circuit 22 is structured of a latch circuit 22A, latch circuit 22B, and latch circuit 22C in correspondence with the respective bits in the image signal.

Next, the operation is explained.

The switch 25 and the first latch circuit 21 sample the externally input 3-bit image signal Sg pursuant to the control of the shift register 20.

Then, in the timing shown with the externally input latch signal S1, the switch 24 transfers to the respective latch circuits 22A~22C in the second latch circuit 22 digital image signal Sg per each sampled bit.

Thereafter, in the timing of line-sequencing the light-emitting polymer 14 in the respective pixels 11, the second latch circuit 22 outputs to the D/A converter 23 for the respective data lines 6 the transferred digital image signal Sg per each bit.

Next, the respective D/A converters 23 convert the input digital image signal Sg into an analog image signal, and outputs such signal to the respective data lines 6. The analog image signal has a large current value in proportion to the digital value shown with digital image signal Sg for each data line 6.

Then, pursuant to the analog image signal, a prescribed current is applied to the light-emitting polymer 14 via the respective TFTs 13, and the light-emitting polymer 14 will illuminate.

The detailed structure and operation of the D/A converter 23 are now explained with reference to FIG. 5.

As shown in FIG. 5, the D/A converter 23 is structured of switches 30A, 31A and TFT 32A provided in correspondence with the first bit signal Sg, showing the first bit (corresponds to $2^0$) in digital image signal Sg; switches 30B, 31B and TFT 32B provided in correspondence with the second bit signal $Sg_b$ showing the second bit (corresponds to $2^1$) in digital image signal Sg; switches 30C, 31C and TFT 32C provided in correspondence with the third bit signal $Sg_c$ showing the third bit (corresponds to $2^2$) in digital image signal Sg; TFT 33 provided commonly to the respective bits and TFT 34 as the additional-basic-current application means, resistors 35~38, and gate switching circuit 39. Here, as obvious from FIG. 5, the current mirror circuit is structured from the respective TFTs 32A, 32B, 32C, 34, and TFT 33.

The channel widths in the respective TFTs 32A, 32B, and 32C have the following relationship. In other words, if the channel width of TFT 32A is W, the channel width of TFT 32B is 2W, and the channel width of TFT 32C is 4W. Here, the channel lengths of TFTs 32A, 32B, 32C, 33, and 34 are equal.

According to this structure, the current I which flows to TFT 32A when both TFT 33 and TFT 32A simultaneously become the ON state is, when the current flowing to TFT 33 is i and the channel width of TFT 33 is w, $$I=i\times(2W/w)$$

Next, the current I' which flows to TFT 32B when both TFT 33 and TFT 32B simultaneously become the ON state is, $$I'=i\times(2W/w)=2I$$

Next, the current I" which flows to TFT 32C when both TFT 33 and TFT 32C simultaneously become the ON state is, $$I''=i\times(4W/w)=4I$$

Figure 6:
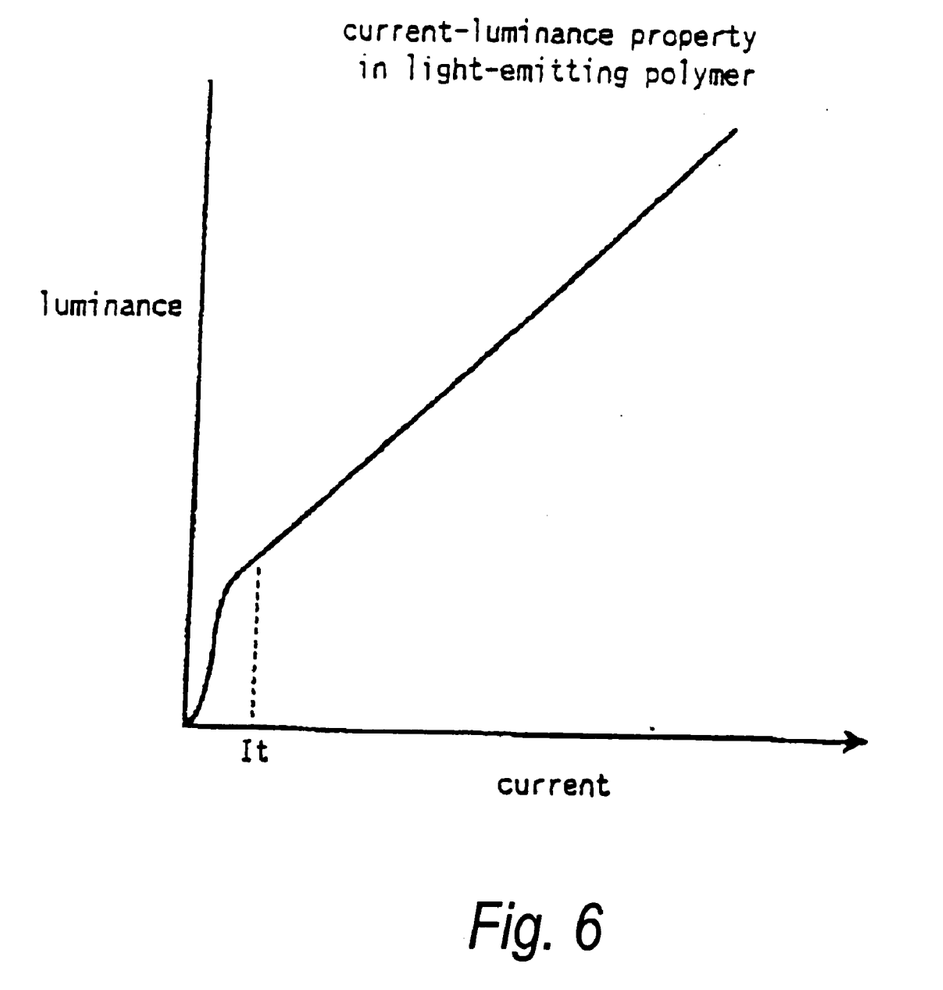
FIG. 6 is a diagram showing the current-luminance property in the light-emitting polymer.

Meanwhile, the channel width of TFT 34 is the channel width of the flow of the current having current quantity It when both TFT 33 and TFT 34 simultaneously become the ON state. The aforementioned current quantity It is the minimum current quantity within the range of currents in which the luminance of the light-emitting polymer changes in proportion to the current quantity pursuant to the current-luminance property of the light-emitting polymer 14 (cf. FIG. 6).

The operation is now explained.

As shown in FIG. 5, based on the first bit signal $Sg_a$ and in the timing of driving the pixel 11 in line sequence, the latch circuit 22A turns the switch 31A ON and simultaneously turns the switch 30A OFF when the first bit signal $Sg_a$ is "1". Moreover, in the same timing, when the first bit signal $Sg_a$ is "0", the latch circuit 22A turns the switch 31A OFF and simultaneously turns the switch 30A ON.

Similarly, based on the second bit signal $Sg_b$ and in the timing of driving the pixel 11 in line sequence, the latch circuit 22B turns the switch 31B ON and simultaneously turns the switch 30B OFF when the second bit signal $Sg_b$ is "1". Moreover, in the same timing, when the second bit signal $Sg_b$ is "0", the latch circuit 22B turns the switch 31B OFF and simultaneously turns the switch 30B ON.

Furthermore, based on the third bit signal $Sg_c$ and in the timing of driving the pixel 11 in line sequence as with the latch circuit 22A or 22B, the latch circuit 22C turns the switch 31C ON and simultaneously turns the switch 30C OFF when the third bit signal $Sg_c$ is "1". Moreover, in the same timing, when the third bit signal $Sg_c$ is "0", the latch circuit 22C turns the switch 31C OFF and simultaneously turns the switch 30C ON.

TFTs 32A, 32B and 32C respectively form the current mirror circuit between TFT 33 based on the operations of the respective switches 30A~30C and 31A~31C. That is, when the respective bits are "1", the aforementioned current I, I', or I" is supplied to the data line 6, and when the respective bits are "0", no current is supplied.

Currents I, I', I" which flowed through TFT 32A, 32B, or 32C are mutually added, and are applied to the drain electrode D of the TFT 13 via the data line 6 as analog image signal Sa.

Next, the aforementioned operation is explained by detailed illustration with reference to FIG. 5.

In the following explanation, taken as an example is the case where the second bit signal $Sg_b$ and the third bit signal $Sg_c$ are respectively "1", and the first bit signal $Sg_a$ is "0"; in other words, when "6" ($=2^0\times0+2^1\times1+2^2\times1$) is input as digital image signal Sg.

Digital image signal Sg having the digital value of "6", is, after having been sampled by the first latch circuit 21 and the switch 25, respectively input to the latch circuits 22A, 22B, and 22C respectively as the first bit signal $Sg_a$, second bit signal $Sg_b$, and third bit signal $Sg_c$.

Here, as the first bit signal $Sg_a$ is "0", the latch circuit 22A turns the switch 31A OFF and simultaneously turns the switch 30A ON in the timing of driving the pixel 11 in a line sequence. Thereby, current I does not flow in TFT 32A.

Meanwhile, as the second bit signal $Sg_b$ is "1", the latch circuit 22B turns the switch 31B OFF and simultaneously turns the switch 30B ON in the timing of driving the pixel 11 in a line sequence. Thereby, current I' (=2I) flows in TFT 32B.

Moreover, as the third bit signal $Sg_c$ is "1", the latch circuit 22C turns the switch 31C OFF and simultaneously turns the switch 30C ON in the timing of driving the pixel 11 in a line sequence. Thereby, current I" (=4I) flows in TFT 32C.

Accordingly, the current value supplied to the TFT 13 as the analog image signal is, $$2I+4I=6I$$

In other words, in comparison to the digital value "6" input as digital image signal Sg, the current value supplied as analog image signal Sa is 6I. Thus, the light-emitting polymer 14 illuminates in the luminance corresponding to the digital value "6" (i.e.; six times the luminance of the luminance corresponding to the digital value "1").

Contrarily, in parallel to the operation of TFTs 32A~32C, the gate switching circuit 39 turns the TFT 34 ON when one of the signal a song the first bit signal $Sg_a$~third bit signal $Sg_c$ is "1".

Here, TFT 34 continuously forms the current mirror circuit between TFT 33. When TFT 34 is turned ON, supplied to the data line 6 as the additional basic current is a current having the smallest current quantity It among the range of currents in which the luminance of the light-emitting polymer 14 changes in proportion to the current quantity.

As a result, when the light-emitting polymer 14 in the pixel 11 Is to be lit in a certain luminance, the additional basic current having current value It is constantly superimposed and flowed to analog image signal Sa.

Therefore, as analog image signal Sa is applied within the range where the luminance of the light-emitting polymer 14 changes in proportion to the current value, the light-emitting polymer 14 illuminates in a luminance accurately in proportion to the current value of analog image signal Sa (i.e.; digital value of digital image signal Sg).

As described above, according to the operation of the display device 1 of the present embodiment, the current-driven light-emitting polymer 14 is driven by the current-adding D/A converter 23 and realizes a drive with large driving power. Moreover, since currents that only directly drive the light-emitting polymer 14 are used, electric power consumption is lowered by the generation of wasteful drive currents being suppressed.

Furthermore, as the light-emitting polymer 14 is driven upon providing a TFT 13 to each pixel 11, it is possible to display a high-quality image having high resolution and without any crosstalk in the picture.

In addition, as the respective TFTs 13 are thin film transistors formed from polysilicon, even if a strong current for driving the light-emitting polymer 14 is flowed for a long period of time, the driving power thereof will not lower.

Moreover, as analog image signal Sa is applied upon structuring a current mirror circuit in the D/A converter 23, it is possible to efficiently supply analog image signal Sa to the light-emitting polymer 14.

Further, in comparison with other D/A converter systems, as the number of elements required for the structure is extremely small, this is particularly adequate for drive circuits required to be arranged in a narrow pitch as in display devices.

As the element which self illuminates is a light-emitting polymer 14, obtained are images of high intensity and abundant color reproducibility by molecular-designing appropriate organic materials.

Although the aforementioned embodiment was an explanation employing the light-emitting polymer 14 as the light-emitting element, the present invention may otherwise be widely employed to display elements using current-driven light-emitting elements such as organic or inorganic EL (Electro Luminescence) elements and the like.

(II) Embodiments of the Electronic Apparatus

Next, embodiments of various electronic apparatus employing the display device 1 of the aforementioned embodiment are explained with reference to FIGS. 7~9.

Figure 7:
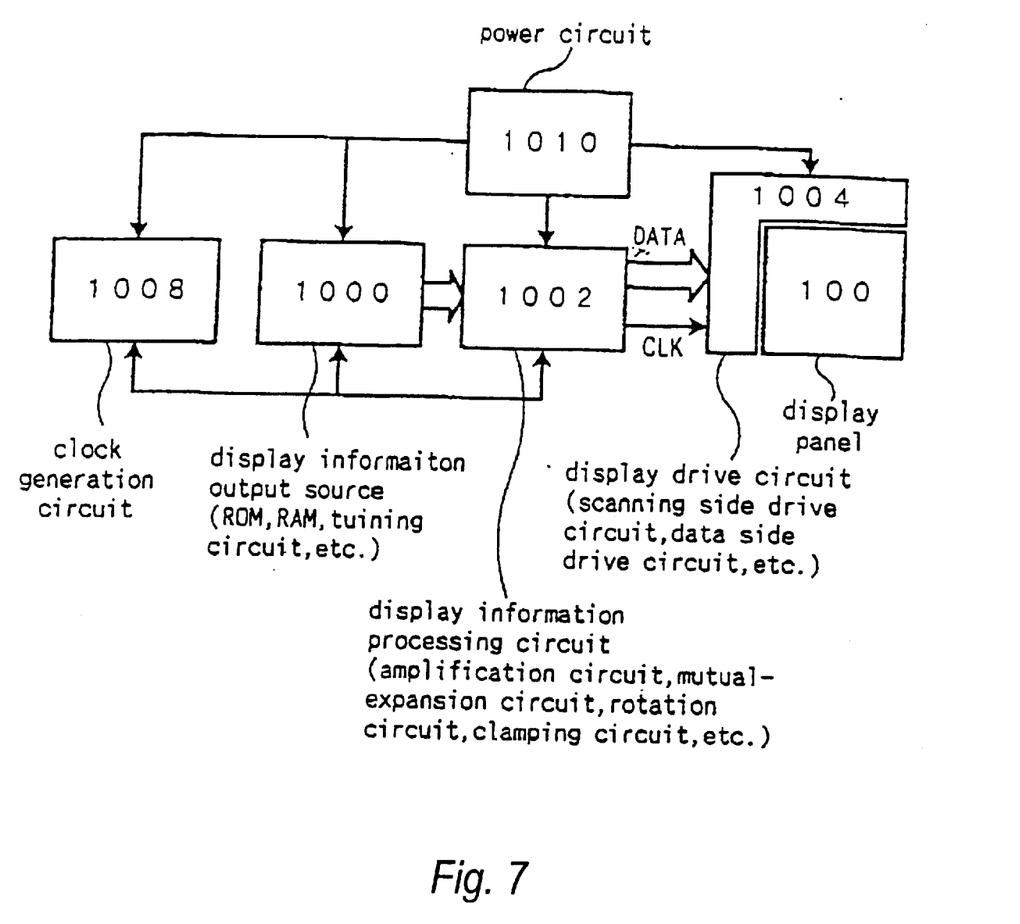
FIG. 7 is a block diagram showing the schematic structure of the electronic apparatus according to the present invention.

The electronic apparatus structured upon employing the display device 1 above, as shown in FIG. 7, includes a display information output source 1000, display information processing circuit 1002, display drive circuit 1004, display panel 1006, clock generation circuit 1008, and power source circuit 1010.

Among the above, the display information output source 1000 includes a memory such as a ROM (Read Only Memory), RAM (Random Access Memory), tuning circuit for tuning and outputting a television signal, and so on. The display information output source 1000 outputs display information such as a video signal based on the clock signal from the clock generation circuit 1008.

The display information processing circuit 1002 processes and outputs the display information based on the clock signal from the clock generation circuit 1008. This display information processing circuit 1002 may include, for example, an amplification circuit, mutual development circuit, rotation circuit or clamping circuit, etc.

The display drive circuit 1004 is structured by including a scanning side drive circuit and data side driving circuit. The display drive circuit 1004 drives the display panel 1006 for display.

The power source circuit 1010 supplies electricity to the respective circuits mentioned above.

Figure 8:
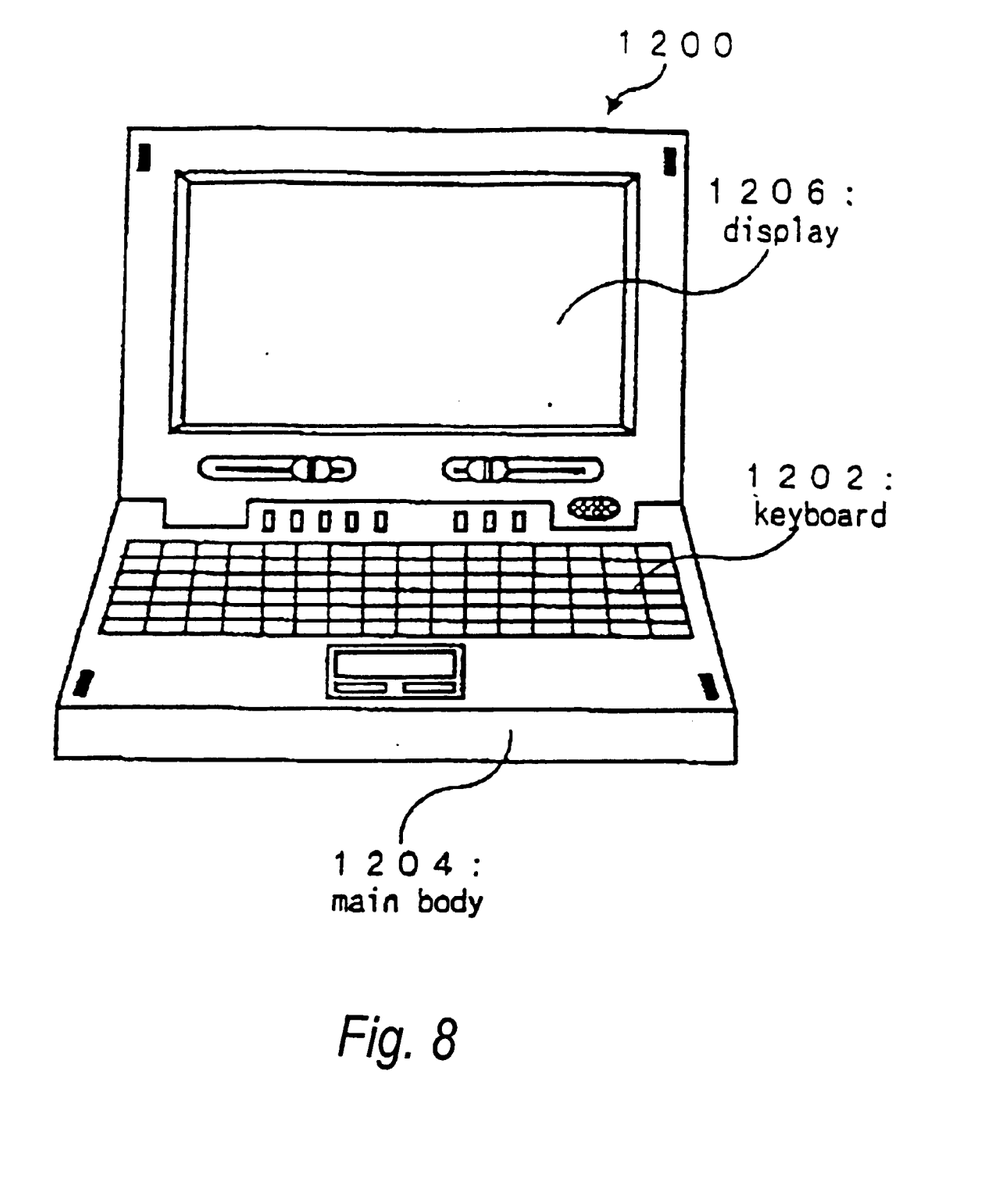
FIG. 8 is a front view showing the appearance of the personal computer of the present invention.

As the electronic apparatus having the aforementioned structure, listed may be a personal computer (PC) and engineering workstation (EWS) shown in FIG. 8 in compliance with multimedia, or a cellular phone, word processor, television, view-finder style or direct monitor-viewing type video tape recorder, electronic notebook, electronic desk-top calculator, car-navigation device, POS terminal, device comprising a touch panel, and so on.

The personal computer shown in FIG. 8 has a main body comprising a keyboard 1202, and a display 1206 including the display device of the present invention.

What is claimed is:

1. A display device comprising:
a plurality of light-emitting elements; and
a D/A converter for providing an analog signal to the plurality of light-emitting elements, the D/A converter including a first transistor and a plurality of transistors, the first transistor enabling to constitute a current mirror circuit with each of the plurality of transistors, each of the plurality of transistors having a gate controlled by a respective bit signal of a digital signal to obtain a current for a current flow through the respective transistor according to a binary state of the respective bit signal, the D/A converter converting the digital signal to an analog signal by adding up the current flows through the plurality of transistors, and the analog signal having a current value according to the digital signal.

2. The display device according to claim 1, the plurality of said transistors having different channel widths from each other.

3. The display device according to claim 1, the analog signal being generated by adding an additional basic current flowing through the plurality of said transistors.

4. The display device according to claim 3, further comprising a second transistor through which the additional basic current flows.

5. The display device according to claim 3, the additional basic current having current level being less than minimum current level within a range of current level in proportion to luminance level of a plurality of said light-emitting elements.

6. The display device according to claim 1, a plurality of said light-emitting elements having a light-emitting polymer.

7. An electric apparatus comprising said display device according to claim 1.

8. A display device comprising:
a data line driving circuit including a plurality of transistors, each of the plurality of transistors having a gate controlled by a respective bit signal of a digital signal to obtain a current for a current flow through the respective transistor according to a binary state of the respective bit signal, said data line driving circuit converting the digital signal to an analog signal corresponding to the digital signal by adding up the currents flowing through the plurality of said transistors, the analog signal having a current value according to the digital signal;
a plurality of scanning lines to supply a scanning signal;
a plurality of data lines connected to said data line driving circuit to supply the analog signal;
a plurality of pixels, each of said pixels comprising:
a switching element connected to one of a plurality of said scanning lines and one of a plurality of said data lines; and
a light-emitting element emitting in accordance with the analog signal; and
a current mirror circuit constituted between each of the plurality of transistors established corresponding to digital signals and a first transistor.

9. The display device according to claim 8, the switching element being a polysilicon thin-film transistor.

10. The display device according to claim 8, the analog signal being generated by adding an additional basic current flowing through the plurality of said transistors.

11. The display device according to claim 10, further comprising a second transistor through which the additional basic current flows.

12. The display device according to claim 10, the additional basic current having current level being less than minimum current level within a range of current level in proportion to luminance level of a plurality of said light-emitting elements.

13. The display device according to claim 8, a plurality of said light-emitting elements having a light-emitting polymer.

14. An electric apparatus comprising said display device according to claim 8.

15. A circuit for converting a digital signal to an analog signal, the circuit comprising a plurality of transistors, each of the plurality of transistors having a gate controlled by a respective bit signal of a digital signal to obtain a current for a current flow through the respective transistor according to a binary state of the respective bit signal, the analog signal generated by adding up the currents flowing through the plurality of transistors, and the analog signal having a current value according to the digital signal; and a current mirror circuit constituted between each of the plurality of transistors established corresponding to digital signals and a first transistor.

16. A circuit for converting a digital signal to an analog signal, the circuit comprising a plurality of transistors, each of the plurality of transistors having a gate controlled by a respective bit signal of a digital signal to obtain a current for a current flow through the respective transistor according to a binary state of the respective bit signal, the analog signal generated by adding an additional current to the currents flowing through the plurality of transistors, and the analog signal having a current value according to the digital signal; and a current mirror circuit constituted between each of the plurality of transistors established corresponding to digital signals and a first transistor.

17. A circuit for converting a digital signal to an analog signal, the circuit comprising:

a plurality of transistors, each of the plurality of transistors having a gate controlled by a respective bit signal of a digital signal to obtain a current for a current flow through the respective transistor according to a binary state of the respective bit signal; and a first transistor enabling to constitute a current mirror circuit with each of the plurality of transistors, wherein an analog signal having a current value according to the digital signal is generated.

18. A circuit for converting a digital signal to an analog signal, the circuit comprising a plurality of transistors, each of the plurality of transistors having a gate controlled by a respective bit signal of a digital signal to obtain a current for a current flow through the respective transistor according to a binary state of the respective bit signal, the plurality of transistors having different channel widths, the analog signal generated by adding an additional current to the currents flowing through the plurality of transistors, and the analog signal having a current value according to the digital signal; and a current mirror circuit constituted between each of the plurality of transistors established corresponding to digital signals and a first transistor.

* * * * *